(12) United States Patent
Cho et al.

(10) Patent No.: US 11,862,457 B2
(45) Date of Patent: Jan. 2, 2024

(54) WAFER CLEANING APPARATUS, METHOD FOR CLEANING WAFER AND METHOD FOR FABRICATING SEMICONDUCTOR DEVICE

(71) Applicant: Samsung Electronics Co., Ltd., Suwon-si (KR)

(72) Inventors: SeongKeun Cho, Suwon-si (KR); Young Hoo Kim, Yongin-si (KR); Seung Min Shin, Suwon-si (KR); Tae Min Earmme, Hwaseong-si (KR); Kun Tack Lee, Suwon-si (KR); Hun Jae Jang, Suwon-si (KR); Eun Hee Jeang, Paju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/098,330

(22) Filed: Jan. 18, 2023

(65) Prior Publication Data

US 2023/0154743 A1 May 18, 2023

Related U.S. Application Data

(62) Division of application No. 17/478,619, filed on Sep. 17, 2021, now Pat. No. 11,581,182.

(30) Foreign Application Priority Data

Feb. 16, 2021 (KR) .......................... 10-2021-0020478

(51) Int. Cl.
*H01L 21/02* (2006.01)
*B08B 3/08* (2006.01)
(Continued)

(52) U.S. Cl.
CPC .......... *H01L 21/02057* (2013.01); *B08B 3/08* (2013.01); *H01L 21/428* (2013.01); *H01L 21/68764* (2013.01)

(58) Field of Classification Search
CPC ............. H01L 21/02057; H01L 21/428; H01L 21/68764; B08B 3/08
See application file for complete search history.

(56) References Cited

U.S. PATENT DOCUMENTS

| 8,248,683 | B2 | 8/2012 | Lee et al. |
| 10,274,519 | B2 | 4/2019 | Lee et al. |

(Continued)

FOREIGN PATENT DOCUMENTS

KR 20200120790 A 10/2020

*Primary Examiner* — Erin F Bergner
(74) *Attorney, Agent, or Firm* — Muir Patent Law, PLLC

(57) ABSTRACT

A wafer cleaning apparatus, a method of cleaning wafer and a method of fabricating a semiconductor device are provided. The method of fabricating the semiconductor device includes disposing a wafer on a rotatable chuck, irradiating a lower surface of the wafer with a laser to heat the wafer, and supplying a chemical to an upper surface of the wafer to clean the wafer, wherein the laser penetrates an optical system including an aspheric lens array, the laser penetrates a calibration window, which includes a first window structure including a first light projection window including first and second regions different from each other, a first coating layer covering the first region of the first light projection window, and a second coating layer covering the second region of the first light projection window, and the first coating layer and the second coating layer have different light transmissivities from each other.

15 Claims, 16 Drawing Sheets

(51) Int. Cl.
*H01L 21/428* (2006.01)
*H01L 21/687* (2006.01)

(56) References Cited

U.S. PATENT DOCUMENTS

| | | |
|---|---|---|
| 2006/0141806 A1 | 6/2006 | Waldfried et al. |
| 2006/0180180 A1 | 8/2006 | Tan |
| 2008/0139885 A1 | 6/2008 | Knapp |
| 2012/0132618 A1 | 5/2012 | Baluja et al. |
| 2014/0231012 A1* | 8/2014 | Hinode ............. H01L 21/67103 |
| | | 156/345.23 |
| 2016/0372317 A1 | 12/2016 | Lee et al. |
| 2020/0251358 A1 | 8/2020 | Cha et al. |
| 2020/0335361 A1 | 10/2020 | Jang et al. |
| 2021/0202280 A1 | 7/2021 | Kim et al. |

\* cited by examiner

140

WAFER CLEANING APPARATUS, METHOD FOR CLEANING WAFER AND METHOD FOR FABRICATING SEMICONDUCTOR DEVICE

This application is a divisional application of U.S. application Ser. No. 17/478,619, filed on Sep. 17, 2021, which claims priority to Korean Patent Application No. 10-2021-0020478, filed on Feb. 16, 2021 and all the benefits accruing therefrom under 35 U.S.C. § 119, the disclosure of each of these applications being incorporated herein by reference in its entirety.

BACKGROUND

1. Technical Field

The present inventive concept relates to a wafer cleaning apparatus. More specifically, the present inventive concept relates to a wafer cleaning apparatus using a laser, a method for cleaning the wafer, and a method for fabricating a semiconductor device.

2. Description of the Related Art

A wet cleaning process, which is indispensable in the semiconductor fabricating process, is a process of cleaning a hard mask or the like on a wafer, using a high-temperature chemical. Such a wet cleaning process may be performed by a batch device. The batch device refers to a cleaning device that wet-cleans a set of wafers by depositing a plurality of wafers as a set in a chemical at the same time.

However, such a batch device may cause problems such as flow defect, poor drying and poor dispersion uniformity on the wafer. Therefore, a conversion to a single-wafer device is required to solve such a problem. The single-wafer device refers to a device that applies each wafer to the wet-cleaning process one by one.

On the other hand, in order to heat the wafer disposed on the single-wafer device, a laser module that irradiates the wafer with a laser may be used. However, there is a problem of difficulty in achieving a uniform temperature on an entire surface of the wafer, due to the influence of the air flow, reflectivity of the wafer and the like.

SUMMARY

Aspects of the present inventive concept provide a wafer cleaning apparatus in which a temperature variation on the entire surface of the wafer is improved and the performance is improved.

Aspects of the present inventive concept also provide a method for cleaning a wafer using a wafer cleaning apparatus in which the temperature variation on the entire surface of the wafer is improved and the performance is improved.

Aspects of the present inventive concept also provide a method for fabricating a semiconductor device using the wafer cleaning apparatus in which the temperature variation on the entire surface of the wafer is improved and the performance is improved.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a method of fabricating a semiconductor device, the method comprising disposing a wafer on a rotatable chuck, irradiating a lower surface of the wafer with a laser to heat the wafer, and supplying a chemical to an upper surface of the wafer to clean the wafer, wherein the laser penetrates an optical system including an aspheric lens array, the laser penetrates a calibration window, which includes a first window structure including a first light projection window including first and second regions different from each other, a first coating layer covering the first region of the first light projection window, and a second coating layer covering the second region of the first light projection window, and the first coating layer and the second coating layer have different light transmissivities from each other.

According to an aspect of the present inventive concept, there is provided a wafer cleaning apparatus comprising a chuck configured to receive a wafer, a chemical supply unit configured to supply a chemical onto an upper surface of the wafer, a laser module configured to irradiate a lower surface of the wafer with a laser, and a calibration window configured that the laser is transmitted through the calibration window between the wafer and the laser module, wherein the calibration window includes a light projection window including a lower surface facing the laser module, a first coating layer having a first light transmissivity on the lower surface of the light projection window, and a second coating layer having a second light transmissivity greater than the first light transmissivity on the lower surface of the light projection window.

According to an aspect of the present inventive concept, there is provided a wafer cleaning apparatus comprising a rotatable chuck configured to receive a wafer, a chemical supply unit configured to supply a chemical onto an upper surface of the wafer, a laser module configured to irradiate a lower surface of the wafer with a laser, an optical system including an aspherical lens array configured that the laser is transmitted through the optical system between the laser module and the wafer, and a calibration window configured that the laser is transmitted through the calibration window between the optical system and the wafer, wherein the calibration window includes a light projection window including a first region and a second region different from each other, a first coating layer covering the first region of the light projection window, and a second coating layer covering the second region of the light projection window, and the first coating layer and the second coating layer include different light transmissivities from each other.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Hereinafter, a wafer cleaning apparatus according to the exemplary embodiment will be described referring to FIGS. 1 to 8.

Figure 1:
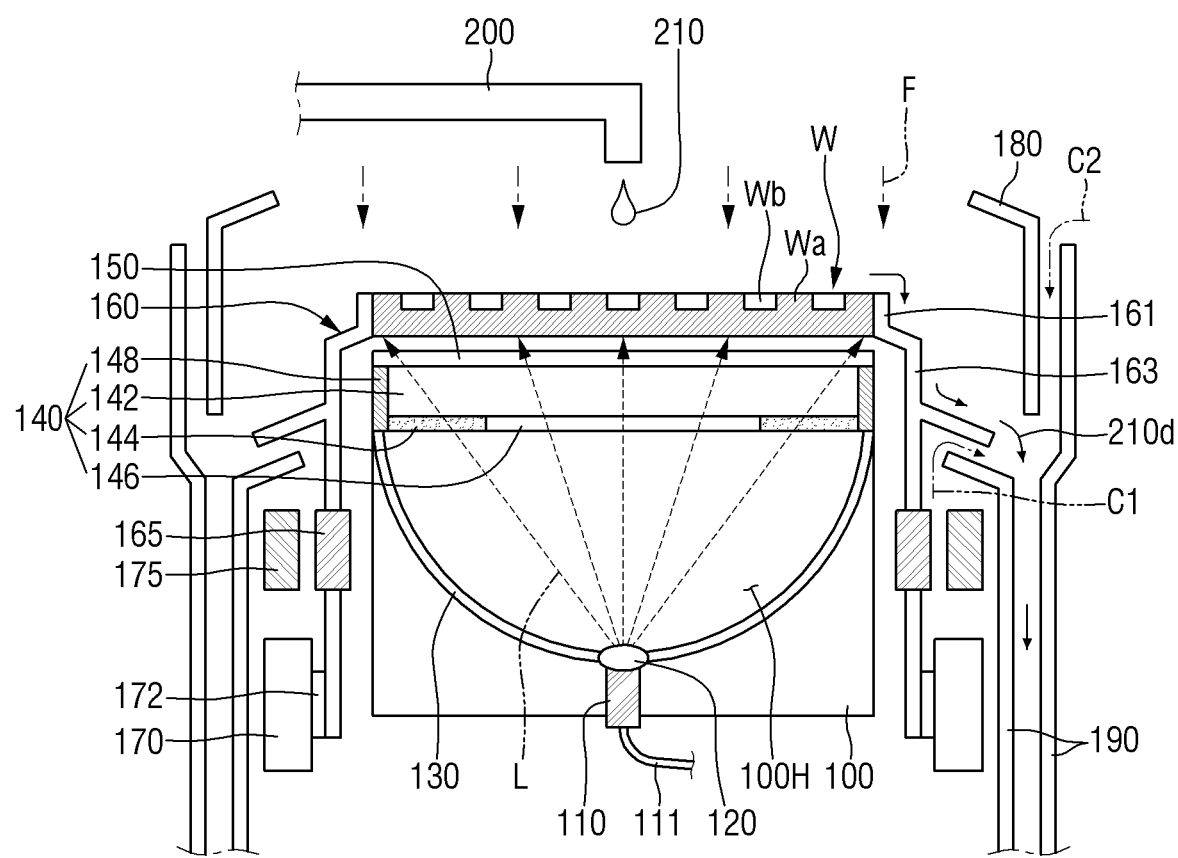
FIG. 1 is a schematic cross-sectional view for explaining a wafer cleaning apparatus according to some embodiments.
Figure 2:
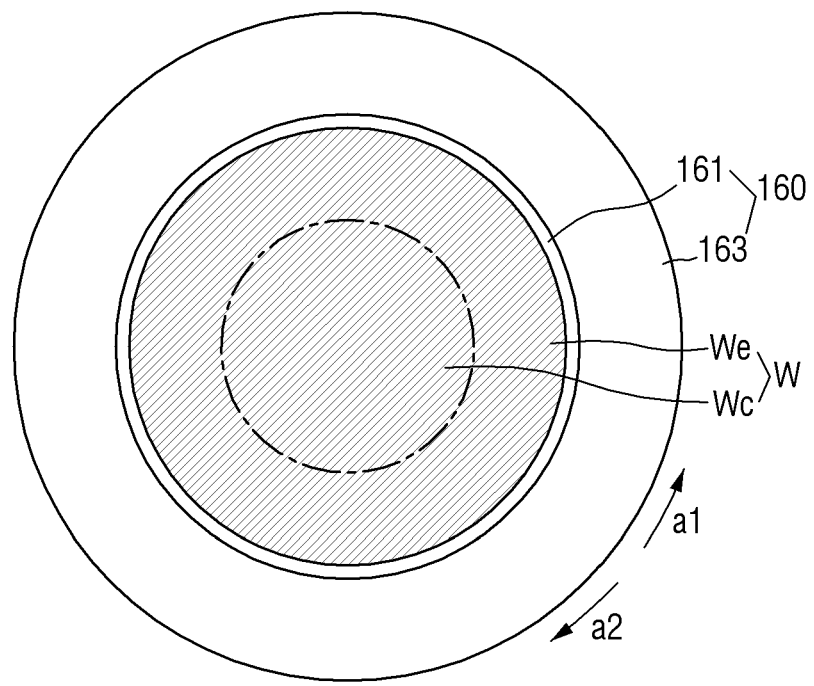
FIG. 2 is a plan view for explaining rotation of a wafer of FIG. 1.
Figure 3:
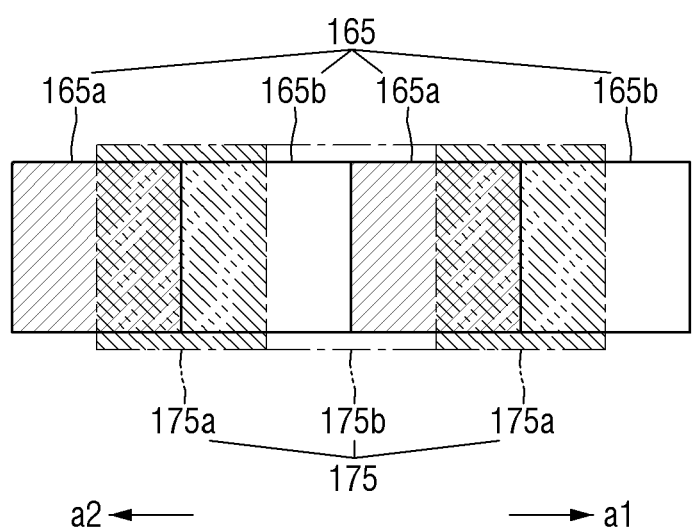
FIG. 3 is a conceptual diagram for explaining the operation of a first rotor unit and a second rotor unit of FIG. 1.
Figure 4:
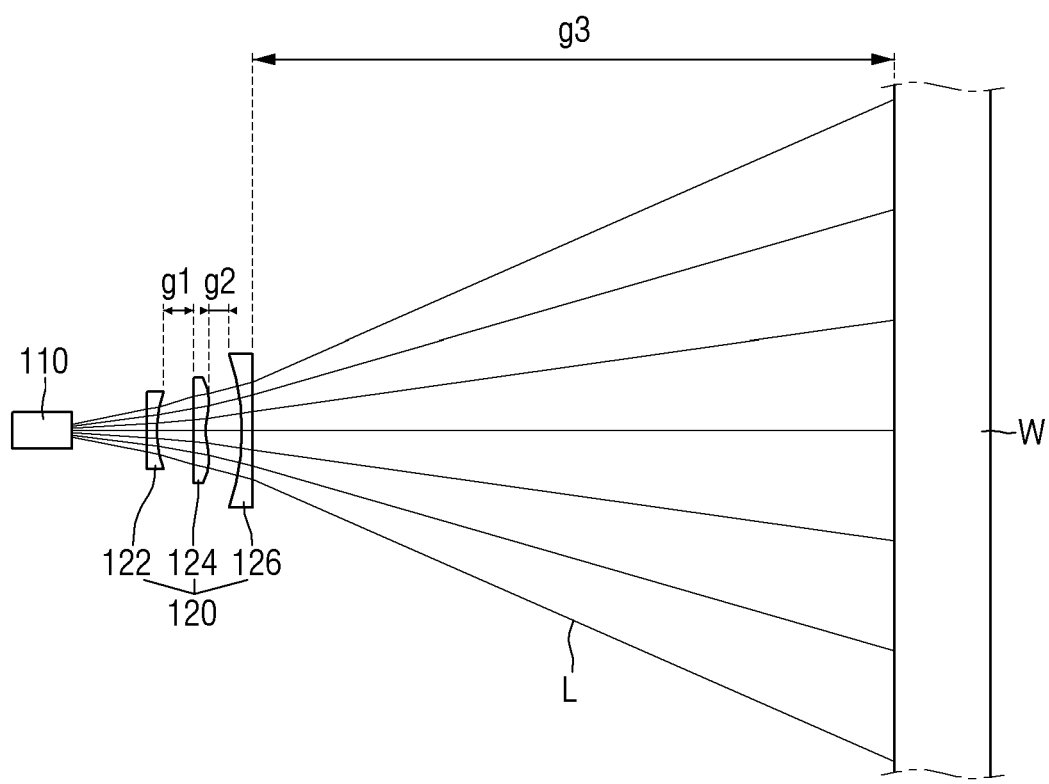
FIG. 4 is a schematic conceptual diagram for explaining an optical system of FIG. 1.
Figure 5:
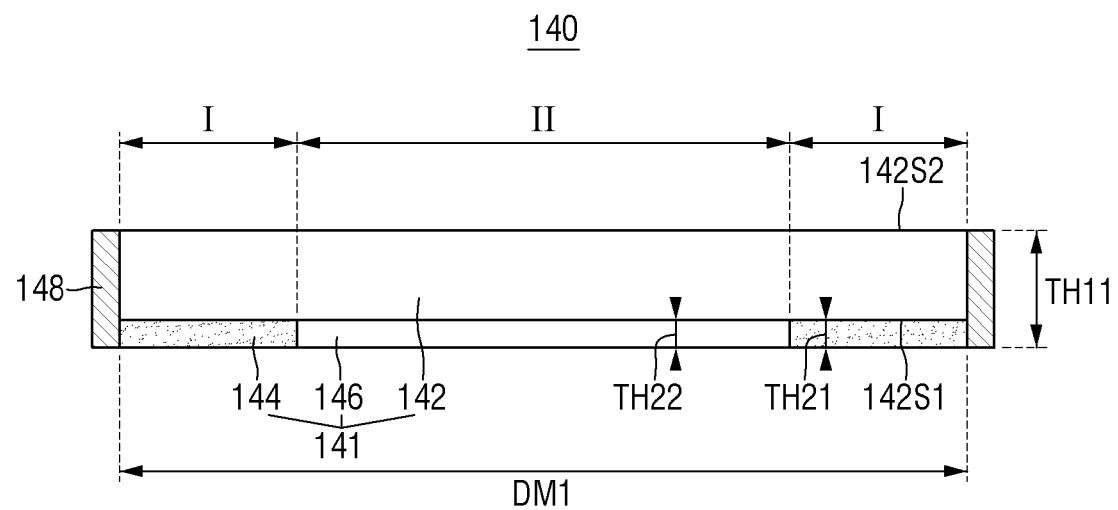
FIG. 5 is a cross-sectional view for explaining a calibration window of FIG. 1.
Figure 6:
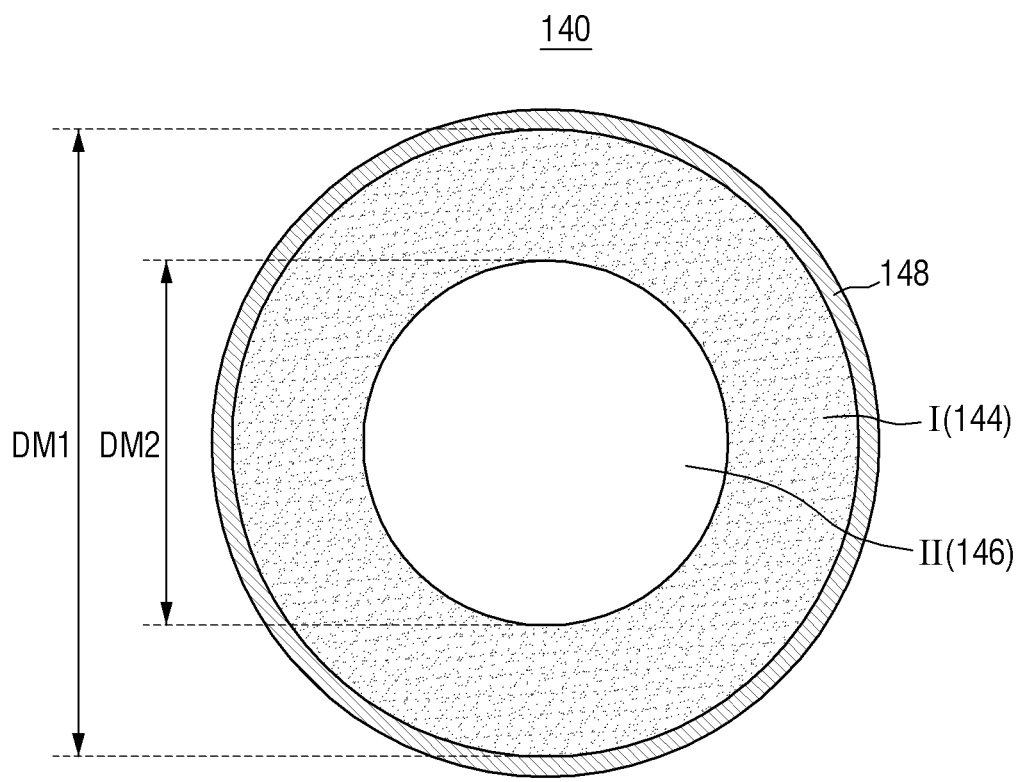
FIG. 6 is a plan view for explaining the calibration window of FIG. 1.
Figure 7:
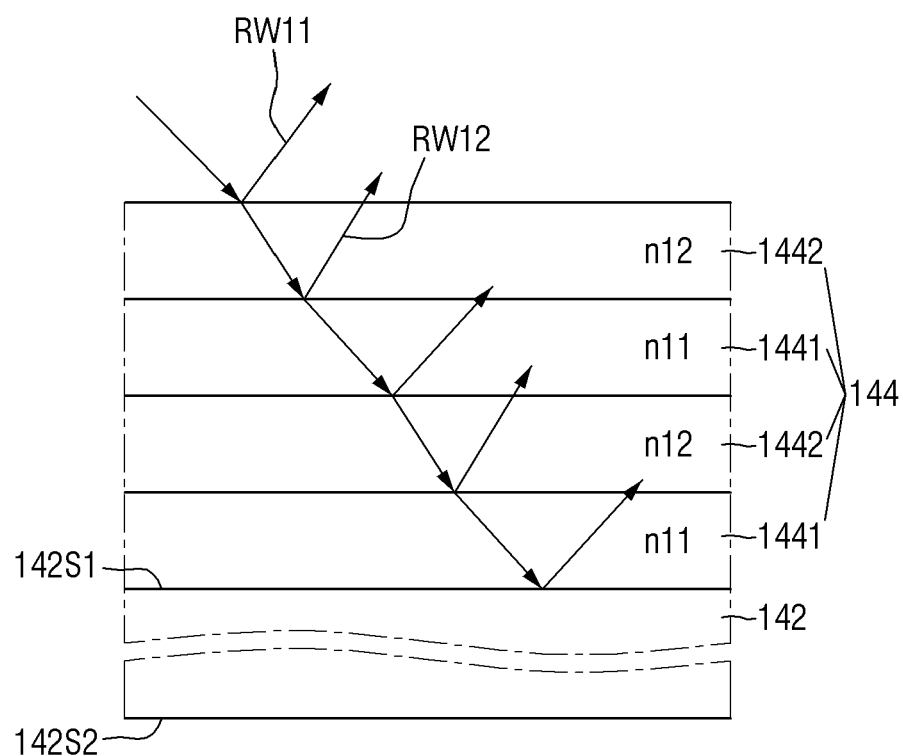
FIG. 7 is an exemplary cross-sectional view for explaining a first coating layer of FIG. 5.
Figure 8:
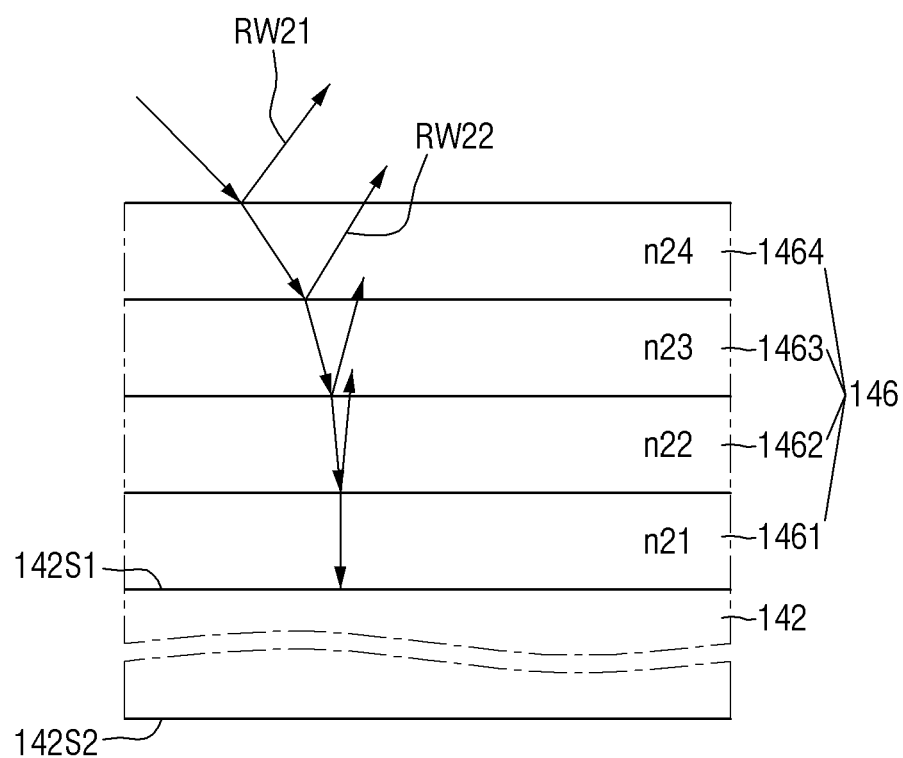
FIG. 8 is an exemplary cross-sectional view for explaining a second coating layer of FIG. 5.

FIG. 1 is a schematic cross-sectional view for explaining a wafer cleaning apparatus according to some embodiments. FIG. 2 is a plan view for explaining rotation of a wafer of FIG. 1. FIG. 3 is a conceptual diagram for explaining the operation of a first rotor unit and a second rotor unit of FIG. 1. FIG. 4 is a schematic conceptual diagram for explaining an optical system of FIG. 1. FIG. 5 is a cross-sectional view for explaining a calibration window of FIG. 1. FIG. 6 is a plan view for explaining the calibration window of FIG. 1. FIG. 7 is an exemplary cross-sectional view for explaining a first coating layer of FIG. 5. FIG. 8 is an exemplary cross-sectional view for explaining a second coating layer of FIG. 5.

Referring to FIGS. 1 to 8, the wafer cleaning apparatus according to some embodiments includes a housing 100, a laser module 110, an optical system 120, a reflector 130, a calibration window 140, a transparent window 150, a chuck 160, a bowl 180, a drain guide portion 190, and a chemical supply unit 200.

A wafer W may be disposed on the chuck 160. The chuck 160 may fix the disposed wafer W. The chuck 160 may be rotatable. As the chuck 160 rotates, the wafer W fixed on/to the chuck 160 may also rotate. For example, as shown in FIG. 2, the wafer W may rotate in a first rotation direction a1 or a second rotation direction a2. The wafer W may include a central region Wc and an edge region We.

In some embodiments, the wafer W may include an exposed portion Wb and a non-exposed portion Wa. The exposed portion Wb may be a region which is irradiated with light in an exposure process of the wafer W, and the non-exposed portion Wa may be a region which is not irradiated with light in the exposure process. For example, an exposure mask (not shown) may be disposed on the wafer W. When light irradiates from the upper part of the exposure mask, the light that has passed through a transmission portion of the exposure mask may irradiate a part of the wafer W to form the exposure portion Wb. The other part of the wafer W that is not irradiated with light by a shielding portion of the exposure mask may form the non-exposed portion Wa. The wafer W including the exposed portion Wb and the non-exposed portion Wa may include, but is not limited to, a photoresist film.

In some embodiments, the chuck 160 may include a grip portion 161 and a side wall portion 163. The grip portion 161 may fix the wafer W by coming into contact with the side surface of the wafer W. Further, the grip portion 161 may include a heat insulating material. When the wafer W is heated by the laser module 110, the grip portion 161 may block transfer of heat to prevent thermal damage of other components (e.g., the side wall portion 163 of the chuck 160). The side wall portion 163 may surround a side surface of a housing 100 to be described below In some embodiments, the rotating chuck 160 may be supported by a fixing portion 170 and a bearing 172. The fixing portion 170 may fix the chuck 160 on the ground on which the wafer cleaning apparatus according to some embodiments is disposed. The fixing portion 170 may not rotate. The bearing 172 may be interposed between the fixing portion 170 and the chuck 160 to allow the chuck 160 to rotate. Accordingly, the chuck 160 may be configured to be rotatable despite it is supported by the fixing portion 170 that does not rotate. Although the bearing 172 is shown as only being interposed between the fixing portion 170 and the side wall portion 163 in FIG. 1, this is only an example, and if rotation of the chuck 160 is allowed, the position of the bearing 172 may be freely changed.

In some embodiments, the chuck 160 may be rotatable by a first rotor unit 165 and a second rotor unit 175. The first rotor unit 165 may be fixed on/to the chuck 160. The second rotor unit 175 may rotate the first rotor unit 165 in a magnetic levitation method. For example, the first rotor unit 165 and the second rotor unit 175 may each include a magnetic material, and may generate a rotational force, using a magnetic force. As the first rotor unit 165 rotates, the chuck 160 and the wafer W may rotate together. Although the first rotor unit 165 is shown as only being fixed on the side wall portion 163 of the chuck 160 in FIG. 1, this is only an example. As long as the first rotor unit 165 is configured to rotate the chuck 160, the position of the first rotor unit 165 may be freely changed.

As an example, as shown in FIG. 3, the first rotor unit 165 may include a first magnetic pole region 165a and a second magnetic pole region 165b, and the second rotor unit 175 may include a third magnetic pole region 175a and a fourth magnetic pole region 175b. The first magnetic pole region 165a and the second magnetic pole region 165b may be alternately disposed in the first rotor unit 165, and the third magnetic pole region 175a and the fourth magnetic pole region 175b may be alternately disposed in the second rotor unit 175. The first magnetic pole region 165a and the second magnetic pole region 165b may have magnetic poles different from each other, and the third magnetic pole region 175a and the fourth magnetic pole region 175b may have magnetic poles different from each other. Also, the first magnetic pole region 165a and the third magnetic pole region 175a may have the same magnetic pole, and the second magnetic pole region 165b and the fourth magnetic pole region 175b have the same magnetic pole. As an example, the first magnetic pole region 165a and the third magnetic pole region 175a may be an N-pole, and the second magnetic pole region 165b and the fourth magnetic pole region 175b may be an S-pole. Each of the first to fourth magnetic pole regions 165a, 165b, 175a, and 175b may be implemented as, but is not limited to, an electromagnet.

As the first to fourth magnetic pole regions 165a, 165b, 175a, and 175b are alternately disposed, the first rotor unit 165 may rotate in the first rotation direction a1 or the second rotation direction a2. For example, as the first to fourth magnetic pole regions 165a, 165b, 175a, and 175b are alternately disposed, there may be a repulsive force between the first magnetic pole region 165a and the third magnetic pole region 175a, and there may be an attractive force between the first magnetic pole region 165a and the fourth magnetic pole region 175b. Similarly, there may be an attractive force between the second magnetic pole region 165b and the third magnetic pole region 175a, and there may be a repulsive force between the second magnetic pole region 165b and the fourth magnetic pole region 175b. Accordingly, the first rotor unit 165 may rotate in a direction in which the first magnetic pole region 165a and the third magnetic pole region 175a face each other (or a direction in which the second magnetic pole region 165b and the fourth magnetic pole region 175b face each other). Subsequently, the magnetic pole of the first rotor unit 165 (or the magnetic pole of the second rotor unit 175) may be reversed. Accordingly, the rotation of the first rotor unit 165 may be accelerated and the first rotor unit 165 may continuously rotate.

The chuck 160 may rotate the wafer W at a predetermined rotation speed. As an example, the rotation speed of the chuck 160 may range from about 100 rpm to about 300 rpm. If the rotation speed of the chuck 160 is not enough high, a chemical 210 provided to the wafer W may not be applied evenly. If the rotation speed of the chuck 160 is excessively high, the edge region We of the wafer W may be relatively cooled, and the temperature control may not be easy.

The housing 100 may be disposed under the wafer W, e.g., while the wafer W is processed in the wafer cleaning apparatus. For example, the upper surface of the housing 100 may face the lower surface of the wafer W. The housing 100 may fix and support a laser module 110, an optical system 120, a reflector 130, a calibration window 140, and a transparent window 150, which will be described below. For example, the laser module 110, the optical system 120, the reflector 130, the calibration window 140, and the transparent window 150 may be fixed on and supported by the housing 100. In some embodiments, the housing 100 may be spaced apart from the chuck 160 and the wafer W. Accordingly, the housing 100 may not rotate, even while the chuck 160 and the wafer W rotate together. However, this is merely an example, and the housing 100 may rotate with or separately from the chuck 160.

The laser module 110 may irradiate a lower surface of the wafer W with a laser L. For example, the laser module 110 may be disposed inside the housing 100. The laser L irradiated/emitted from the laser module 110 may penetrate the calibration window 140 and the transparent window 150 to be described later, and may reach the wafer W. The laser L that reaches the wafer W may be used to heat the wafer W.

In some embodiments, the laser module 110 may be provided with the laser L from a laser supply unit 111. The laser supply unit 111 may be connected to the outside of the wafer cleaning apparatus according to some embodiments to form a path through which the laser L is supplied. The laser supply unit 111 may include, but is not limited to, for example, optical fibers.

A wavelength of the laser L provided from the laser supply unit 111 may be, for example, from about 100 nm to about 2000 nm. Preferably, the wavelength of the laser L provided from the laser supply unit 111 may be from about 400 nm to about 1,600 nm. The laser L provided from the laser supply unit 111 may have a single wavelength or may have multiple wavelengths.

The laser L provided from the laser supply unit 111 may be a continuous wave (CW) type or a pulse type. A continuous wave type laser may be a laser that is continuously irradiated/emitted without being turned on/off. A pulse-type laser may be a laser that is periodically turned on/off and irradiated/emitted discontinuously. The frequency of the pulse-type laser may be, for example, about 10 MHz to about 1,000 MHz.

The laser L irradiated/emitted from the laser module 110 may penetrate the optical system 120. The optical system 120 may process the profile of the laser supplied from the laser module 110 and transfer it to the wafer W. For example, the optical system 120 may modify wavelength configurations and/or distributional configurations of the laser supplied form the laser module 110 before transferring it to the wafer W. For example, the optical system 120 may determine intensities of respective directions/angles to which the laser transfers. The laser L processed by the optical system 120 may heat the wafer W, e.g., the whole area of the wafer W.

In some embodiments, the optical system 120 may include an aspheric lens array. As an example, as shown in FIG. 4, the optical system 120 may include first to third aspherical lenses 122, 124, and 126. Although the optical system 120 is only shown as including three aspheric lenses 122, 124, and 126 in FIG. 4, this is merely an example, and the number of aspheric lenses may be variously changed. For example, the optical system 120 may include more than three aspheric lenses or less than three aspheric lenses. In certain embodiments, a spherical lens may be interposed between the aspherical lenses 122, 124, and 126.

The first to third aspherical lenses 122, 124, and 126 may process the profile of the laser L through refraction of the laser L. For example, the first to third aspherical lenses 122, 124, and 126 may provide a flat-top type laser L (e.g., a top-hot beam of laser) to the wafer W.

Gaps between the first and third aspheric lenses 122, 124, and 126 may be adjusted to provide the required/proper profile of the laser L. For example, a first gap g1 between the first aspherical lens 122 and the second aspherical lens 124, a second gap g2 between the second aspherical lens 124 and the third aspherical lens 126 or a third gap g3 between the third aspheric lens 126 and the wafer W may be adjusted. The first to third gaps g1, g2, and g3 may be determined and fixed at the time of fabricating/manufacturing the wafer cleaning apparatus according to some embodiments, and may also be adjustable depending on the size and type of the wafer W.

The reflector 130 may be disposed inside the housing 100. For example, the reflector 130 may be disposed around the laser module 110 and/or the optical system 120. The reflector 130 may re-reflect the laser L that is irradiated/emitted from the laser module 110 and is reflected from the lower surface of the wafer W. Further, the reflector 130 may also block the laser L from reaching other components (e.g., the side wall portion 163 of the chuck 160). As an example, the reflector 130 may have a hemispherical shape whose inner surface faces the lower surface of the wafer W. Therefore, the reflector 130 may improve the efficiency of treatment of the wafer W by the laser L.

The hemispherical reflector 130 may define a hollow region 100H. The laser L irradiated/emitted from the laser module 110 may progress through the hollow region 100H to reach the wafer W.

The transparent window 150 may be disposed on the lower surface of the wafer W, e.g., while the wafer W is processed in the wafer cleaning apparatus. For example, the first transparent window 150 may be disposed on the top of the housing 100. The laser L irradiated/emitted from the laser module 110 may penetrate the transparent window 150. For example, the transparent window 150 may be formed of a transparent material through which the laser L may penetrate. For example, the transparent window 150 may include or be formed of, but is not limited to, quartz.

The transparent window 150 may be disposed adjacent to the wafer W, e.g., while the wafer W is processed in the wafer cleaning apparatus. As a result, the outflow of the laser L penetrating the transparent window 150 to a region other than the wafer W may be minimized. In some embodiments, the transparent window 150 may not be in contact with the wafer W. Accordingly, the transparent window 150 may not rotate, even while the chuck 160 and the wafer W rotate together.

The size of the transparent window 150 may correspond to the size of the wafer W to heat the whole area of the lower surface of the wafer W. For example, the width/diameter of the transparent window 150 may be the same as the width/diameter of the wafer W. For example, the transparent window 150 may be formed/configured to expose the edge region We, as well as the center region Wc, of the wafer W to the laser L.

The calibration window 140 may be disposed inside the housing 100. The calibration window 140 may be interposed between the laser module 110 and the wafer W, e.g., while the wafer W is processed in the wafer cleaning apparatus. As an example, the calibration window 140 may be interposed between the reflector 130 and the transparent window 150. The calibration window 140 may adjust the transmissivity of the laser L irradiated/emitted from the laser module 110 for each region.

For example, as shown in FIGS. 5 and 6, the calibration window 140 may include a first region I and a second region II different from each other. As an example, the first region I may surround the second region II, e.g., in a plan view. At this time, a first light transmissivity of the first region I may be different from a second light transmissivity of the second region II. As an example, the first light transmissivity of the first region I may be smaller/less than the second light transmissivity of the second region II. As another example, the first light transmissivity of the first region I may be greater than the second light transmissivity of the second region II. Here, the light transmissivity may be a ratio of the laser L passing through the calibration window 140 to the laser L incident on the calibration window 140. For convenience of explanation, a case where the first light transmissivity is smaller than the second light transmissivity will be mainly described below.

Therefore, the calibration window 140 may provide the calibrated laser L to the wafer W. For example, the calibration window 140 may transmit the calibrated laser L toward the wafer W. As an example, the first light transmissivity of the first region I may be smaller than the second light transmissivity of the second region II. In such a case, an amount of light of the laser L that penetrates the first region I and reaches the edge region We of the wafer W may be smaller than an amount of light of the laser L that penetrates the second region II and reaches the central region Wc of the wafer W.

In some embodiments, the annular (or donut-like) first region I may have a shape that shares a center with the circular second region II. However, the shapes, sizes, numbers, and the like of the first region I and the second region II are merely examples, and are not limited thereto.

In some embodiments, an annular (or donut-like) first coating layer 144 may surround a circular second coating layer 146. As an example, as shown in FIG. 6, a diameter DM2 of the second coating layer 146 may be from about 200 mm to about 350 mm, a diameter DM1 of the first coating layer 144 may be greater than the diameter DM2 of the second coating layer 146. Preferably, the diameter DM2 of the second coating layer 146 may be from about 250 mm to about 330 mm, and the diameter DM1 of the first coating layer 144 may be about 400 mm or less.

In some embodiments, the calibration window 140 may include a lens barrel 148 and a window structure 141. The lens barrel 148 may fix and support the window structure 141. For example, the window structure 141 may be fixed on and supported by the lens barrel 148. For example, the lens barrel 148 may surround the side surfaces of the window structure 141. The lens barrel 148 may have, but is not limited to, for example, a cylindrical shape. The lens barrel 148 may include or be formed of, but is not limited to, for example, at least one of aluminum (Al) and steel use stainless (SUS). The window structure 141 may be disposed inside the lens barrel 148. As an example, the window structure 141 may be, but is not limited to, a disk type.

A thickness TH11 of the window structure 141 may be appropriately selected as needed. For example, the thickness TH11 of the window structure 141 may be, but is not limited to, from about 1 mm to about 100 mm. Preferably, the thickness TH11 of the window structure 141 may be from about 5 mm to about 50 mm.

The size of the window structure 141 may correspond to the size of the wafer W to heat the whole area of the lower surface of the wafer W. For example, the window structure 141 may be formed to expose to the edge region We of the wafer W by the laser L. As an example, when a 300 mm wafer W is used, the diameter of the window structure 141 (e.g., DM1 of FIG. 5) may be from about 250 mm to about 400 mm.

In some embodiments, the window structure 141 may include a light projection window 142, a first coating layer 144, and a second coating layer 146.

The light projection window 142 may include a lower surface 142S1 and an upper surface 142S2 that are opposite to each other. In some embodiments, the lower surface 142S1 of the light projection window 142 may be disposed to face the laser module 110, and the upper surface 142S2 of the light projection window 142 may be disposed to face the wafer W, e.g., while the wafer W is processed in the wafer cleaning apparatus. The light projection window 142 may include or be formed of, but is not limited to, for example, at least one of a borosilicate glass (e.g., BK7) and a fused silica glass.

The first coating layer 144 and the second coating layer 146 may cover the light projection window 142. The first coating layer 144 may cover the light projection window 142 of the first region I, and the second coating layer 146 may cover the light projection window 142 of the second region II. In some embodiments, the first coating layer 144 and the second coating layer 146 may extend along the lower surface 142S1 of the light projection window 142. As an example, the first coating layer 144 may extend along the lower surface 142S1 of the light projection window 142 of the first region I, and the second coating layer 146 may extend along the lower surface 142S1 of the light projection window 142 of the second region II.

The first coating layer 144 and the second coating layer 146 may have light transmissivities different from each other. As an example, the first light transmissivity of the first coating layer 144 may be smaller than the second light transmissivity of the second coating layer 146. As an example, the first light transmissivity may be from about 50% to about 95%, and the second light transmissivity may be from about 95% to about 99.9%. Preferably, the first light transmissivity may be from about 80% to about 95%, and the second light transmissivity may be from about 95% to about 99.9%.

A thickness TH21 of the first coating layer 144 and a thickness TH22 of the second coating layer 146 may be appropriately selected to achieve the required light transmissivity. For example, each of the thickness TH21 of the first coating layer 144 and the thickness TH22 of the second coating layer 146 may be, but is not limited to, about 100 nm to about 10,000 nm. Preferably, each of the thickness TH21 of the first coating layer 144 and the thickness TH22 of the second coating layer 146 may be about 500 nm to about 5,000 nm. More preferably, each of the thickness TH21 of the first coating layer 144 and the thickness TH22 of the second coating layer 146 may be about 900 nm to about 1,000 nm.

Although only a case where the thickness TH21 of the first coating layer 144 and the thickness TH22 of the second coating layer 146 are the same is shown in FIG. 5, this is merely an example. Unlike the shown case in FIG. 5, the thickness TH21 of the first coating layer 144 may be greater or smaller than the thickness TH22 of the second coating layer 146. For example, the thicknesses TH21 and TH22 may be different from each other.

The first coating layer 144 and the second coating layer 146 may each include or be formed of, for example, an oxide. As an example, the first coating layer 144 and the second coating layer 146 may include or be formed of, but are not limited to, at least one of a silicon oxide and a hafnium oxide.

In some embodiments, the first coating layer 144 may include or be formed of a high-reflection coating (HR coating) material. The high-reflection coating material may provide high reflectivity and low transmissivity, using a constructive interference of Fresnel reflection.

For example, as shown in FIG. 7, the first coating layer 144 may include first and second sub-coating layers 1441 and 1442 that are alternately stacked on the light projection window 142. A refractive index n1 of the first sub-coating layer 1441 may be lower than a refractive index n2 of the second sub-coating layer 1442. As an example, the first sub-coating layer 1441 may include or be formed of silicon oxide, and the second sub-coating layer 1442 may include or be formed of hafnium oxide. Therefore, an example, a first reflected light RW11 generated on or reflected from the surface of the second sub-coating layer 1442 may achieve the constructive interference with a second reflected light RW12 generated on or reflected from the surface of the first sub-coating layer 1441.

The thickness of each of the first and second sub-coating layers 1441 and 1442 may be appropriately selected depending on the wavelength λ of the laser L to induce the constructive interference. As an example, the thickness of the second sub-coating layer 1442 may be ¼λ.

In some embodiments, the second coating layer 146 may include an anti-reflection coating (AR coating) material. The anti-reflection coating material may provide low reflectivity and high transmissivity, using the destructive interference of Fresnel reflection.

For example, as shown in FIG. 8, the second coating layer 146 may include third to sixth sub-coating layers 1461 to 1464 that are sequentially stacked on the light projection window 142. The refractive indexes n21 to n24 of the third to sixth sub-coating layers 1461 to 1464 may decrease in a direction receding from the light projection window 142. As an example, the fifth sub-coating layer 1463 may include or be formed of hafnium oxide, and the sixth sub-coating layer 1464 may include or be formed of silicon oxide. Therefore, as an example, a third reflected light RW21 generated on or reflected from the surface of the sixth sub-coating layer 1464 may achieve the destructive interference with a fourth reflected light RW22 generated on or reflected from the surface of the fifth sub-coating layer 1463.

The thickness of each of the third to sixth sub-coating layers 1461 to 1464 may be appropriately selected depending on the wavelength λ of the laser L to induce the destructive interference. As an example, the thickness of the sixth sub-coating layer 1464 may be ¼λ.

In some embodiments, both the first coating layer 144 and the second coating layer 146 may include the anti-reflection coating material. As an example, the first coating layer 144 may include an anti-reflection coating material having a first light transmissivity, and the second coating layer 146 may include an anti-reflection coating material having a second light transmissivity greater than the first light transmissivity.

Although FIGS. 5 to 8 show that the first coating layer 144 and the second coating layer 146 are formed on the lower surface 142S1 of the light projection window 142, this is merely an example. Unlike the shown cases in the figures, the first coating layer 144 and the second coating layer 146 may be formed on the upper surface 142S2 of the light projection window 142, and may be formed on both the lower surface 142S1 and the upper surface 142S2 of the light projection window 142.

Although FIG. 1 shows that the calibration window 140 is in contact with the reflector 130 and the transparent window 150, this is merely an example. Unlike the shown case in FIG. 1, the calibration window 140 may be spaced apart from the reflector 130 or from the transparent window 150 in certain embodiments.

In some embodiments, the calibration window 140 may cover the reflector 130. For example, the calibration window 140 may vertically overlap the whole area of the reflector 130. In such cases, the hollow region 100H may be isolated from the outside by the reflector 130 and the calibration window 140. The reflector 130 and the calibration window 140 may prevent the hollow region 100H where the laser L progresses from being contaminated by a fume generated from the chemical 210 to be described below. In some embodiments, the hollow region 100H may be provided and/or maintained with vacuum state. The hollow region 100H provided with vacuum state may be beneficial for and/or facilitate the progress of the laser L.

The chemical supply unit 200 may be disposed over the chuck 160. The chemical supply unit 200 may supply the chemical 210 to the upper surface of the wafer W. The chemical 210 may include various substances for cleaning the wafer W. For example, the chemical 210 may include, but is not limited to, at least one of phosphoric acid, aqueous ammonia and TMAH (Tetramethylammonium hydroxide).

In some embodiments, the chemical 210 may perform a developing process on the wafer W. For example, the chemical 210 supplied to the wafer W may remove a portion of photoresist layer disposed on either the exposed portion Wb or the non-exposed portion Wa.

As an example, by the exposure process of the wafer W, the solubility of the exposed portion Wb in the chemical 210 may be increased compared to the solubility of the non-exposed portion Wa in the chemical 210. In such a case, the chemical 210 supplied to the wafer W may remove the exposed portion Wb, and the non-exposed portion Wa may remain to form a photoresist pattern. For example, a positive tone development (PTD) process may be performed.

As another example, the exposed portion Wb may be cured by the exposure process of the wafer W. In such a case, the chemical 210 supplied to the wafer W may remove the unexposed portion Wa, and the cured exposed portion Wb may remain to form a photoresist pattern. For example, a negative tone development (NTD) process may be performed.

The chemical supply unit 200 may be, but is not limited to, for example, a nozzle. Although the chemical 210 is only shown as being supplied to the center of the wafer W in FIG. 1, this is merely an example, and the chemical 210 may be supplied from the edge of the wafer W in certain embodiments.

The chemical supply unit 200 may provide the chemical 210 at a predetermined flow rate. As an example, the chemical supply unit 200 may provide the chemical 210 at a flow rate of about 0.1 L/min to about 1 L/min. When the flow rate of the chemical 210 is not sufficiently large/great, the cleaning speed may be slow, and when the flow rate of the chemical 210 is excessively large/great, heating of the wafer W by the laser L may be slow or may be insufficient.

As the wafer W rotates along with the chuck 160, the chemical 210 provided from the chemical supply unit 200 may spread along the upper surface of the wafer W. Accordingly, the chemical 210 may clean the entire upper surface of the wafer W. In some embodiments, a first flow F may be applied in the direction toward the upper surface of the wafer W for fixation of the wafer W and uniform spreading of the chemical 210. For example, the first flow F may be a gas flow, and the gas flow may be controlled by a pressure difference (e.g., vacuum level difference) of the gas. The first flow F allows the chemical 210 to move from the central region We of the wafer W to the edge region We of the wafer W. The first flow F may include or be formed of, but is not limited to, an inert gas such as nitrogen ($N_2$) gas.

The bowl 180 may be disposed outside the chuck 160 to surround the chuck 160, e.g., in a plan view. Also, the bowl 180 may be disposed to be higher than the chuck 160 and the wafer W. The bowl 180 may block the outflow of the chemical 210 and/or the vaporized fume of the chemical 210 to the outside.

The drain guide portion 190 may guide a drain path of the chemical 210 and/or the fume. As an example, the chemical 210 moved to the edge region We of the wafer W by the first flow F and/or centrifugal force generated by the rotation of the wafer W may reach the drain guide portion 190 via the side wall portion 163 of the chuck 160. The chemical 210 that has reached the drain guide portion 190 may be discharged to the outside as a drain chemical 210*d*. In some embodiments, the drain guide portion 190 may be disposed to be lower than the bowl 180. Also, in some embodiments, the drain guide portion 190 may be spaced apart from the wafer W farther than the chuck 160 and the housing 100, e.g., in a plan view. This configuration may be beneficial to prevent other components (e.g., the chuck 160) from being damaged by the drain chemical 210*d*.

In some embodiments, a second flow C1 and a third flow C2 may be applied toward the drain guide portion 190. The second flow C1 and the third flow C2 may be gas flows. As an example, as shown in FIG. 1, the second flow C1 may be provided between the side wall portion 163 and the drain guide portion 190 of the chuck 160, and the third flow C2 may be provided between the bowl 180 and the drain guide portion 190. The second flow C1 and the third flow C2 may prevent the chemical 210 and/or the fume from flowing backward (e.g., toward the wafer W), and may cool the wafer cleaning apparatus according to some embodiments. Each of the second flow C1 and the third flow C2 may include, but are not limited to, a refrigerant such as nitrogen ($N_2$) gas.

In some embodiments, the second flow C1 may be directed toward the drain guide portion 190 via a space between the first rotor unit 165 and the second rotor unit 175. Such a second flow C1 may prevent the first rotor unit 165 and the second rotor unit 175 including a magnetic material from being excessively heated, by cooling the first rotor unit 165 and the second rotor unit 175.

Hereinafter, the effects of the wafer cleaning apparatus according to the exemplary embodiment will be described referring to FIGS. 1 to 9.

Figure 9:
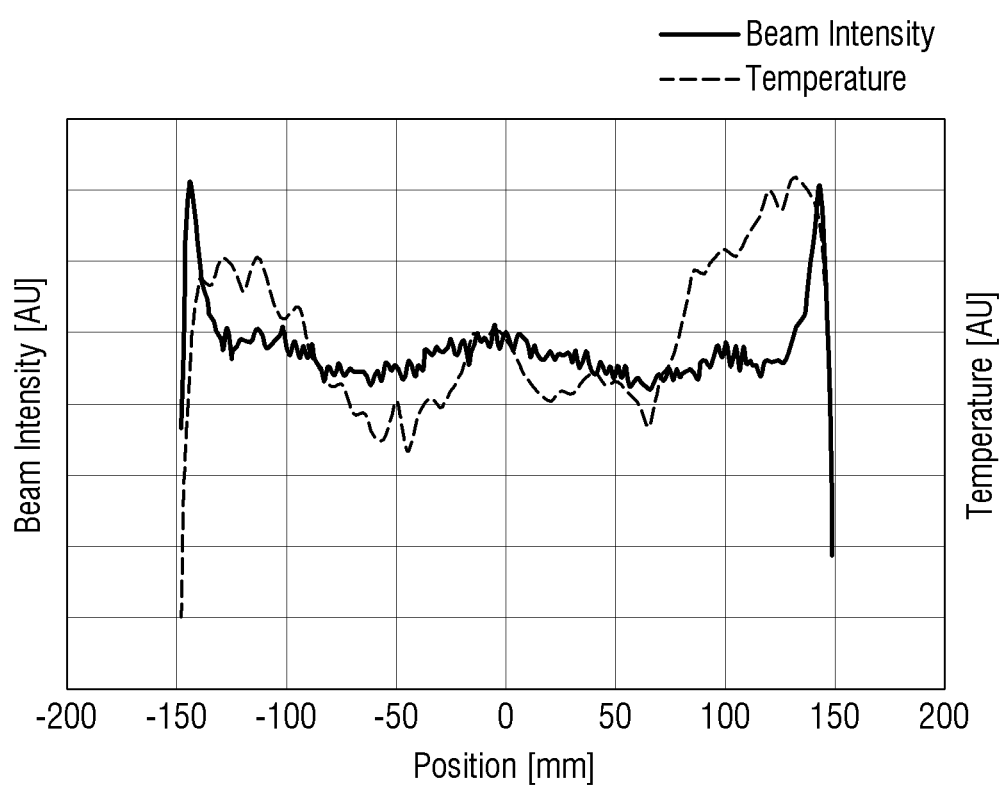
FIG. 9 is an exemplary graph showing intensity and temperature of the laser depending on the position of the wafer.

FIG. 9 is an exemplary graph showing intensity and temperature of the laser depending on the position of the wafer. For reference, a horizontal axis (x-axis) of FIG. 9 indicates a distance from the center of the wafer W, and a vertical axis (y-axis) of FIG. 9 indicates intensity (or an amount of light) of the laser L reaching the wafer W and the temperature of the wafer W.

Referring to FIG. 9, the intensity (or an amount of light) of the laser L reaching the wafer W and the temperature of the wafer W may not be uniform on the entire surface of the wafer W. As an example, the intensity of the laser L and the temperature of the wafer W in the edge region We (e.g., 100 mm to 150 mm) of the wafer W may be higher than the intensity of the laser L and the temperature of the wafer W in the central region We (e.g., —100 mm to 100 mm) of the wafer W. This may be caused by various causes such as the characteristics of the laser L, a significant difference in reflectivity generated on the lower surface of the wafer W, an influence of airflow generated in the outside of the wafer W, and a significant difference in an oil film thickness formed on the upper surface of the wafer W.

However, the wafer cleaning apparatus according to some embodiments may minimize the intensity variation of the laser L and the temperature variation of the wafer W, by including the calibration window 140. As an example, as described above, the first light transmissivity of the first region I of the calibration window 140 may be smaller/less than the second light transmissivity of the second region II of the calibration window 140. For example, the amount of light of the laser L that penetrates the first region I and reaches the edge region We of the wafer W may be smaller/less than the amount of light of the laser L that penetrates the second region II and reaches the central region We of the wafer W. Accordingly, the temperature variation on the entire surface of the wafer can be improved to provide the wafer cleaning apparatus with improved performance.

Hereinafter, a wafer cleaning apparatus according to the exemplary embodiment will be described referring to FIGS. 10 to 18.

Figure 10:
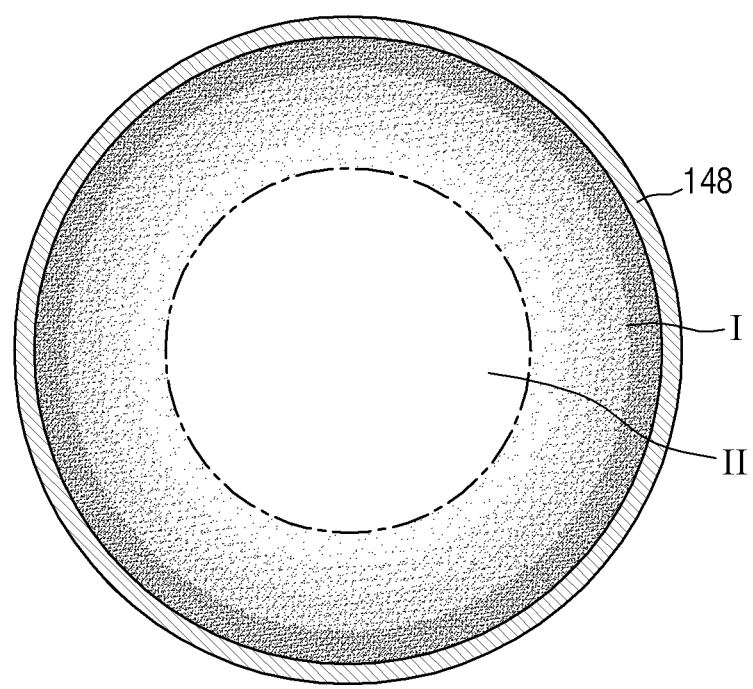
FIGS. 10 to 12 are various plan views for explaining the calibration window of the wafer cleaning apparatus according to some embodiments.
Figure 11:
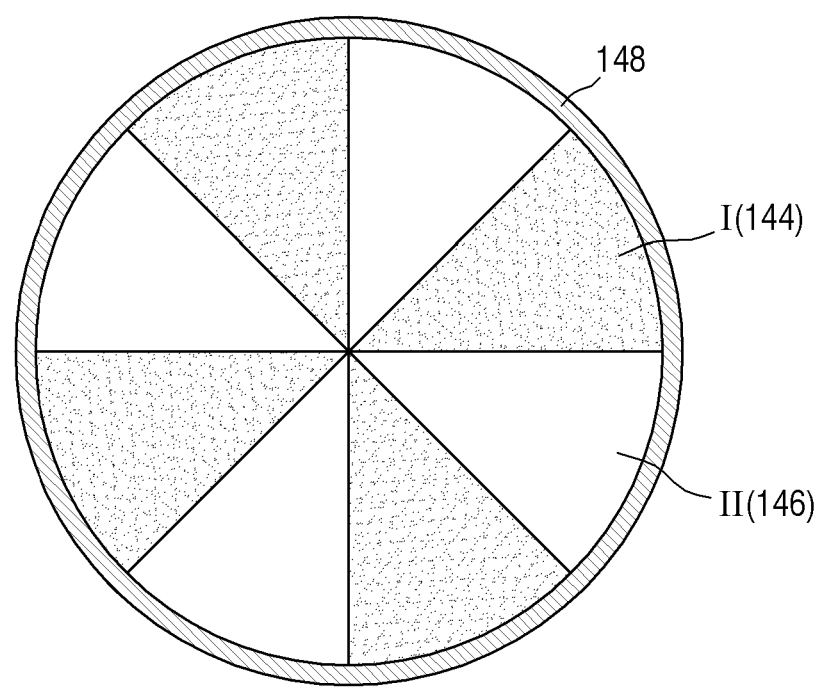
Figure 12:
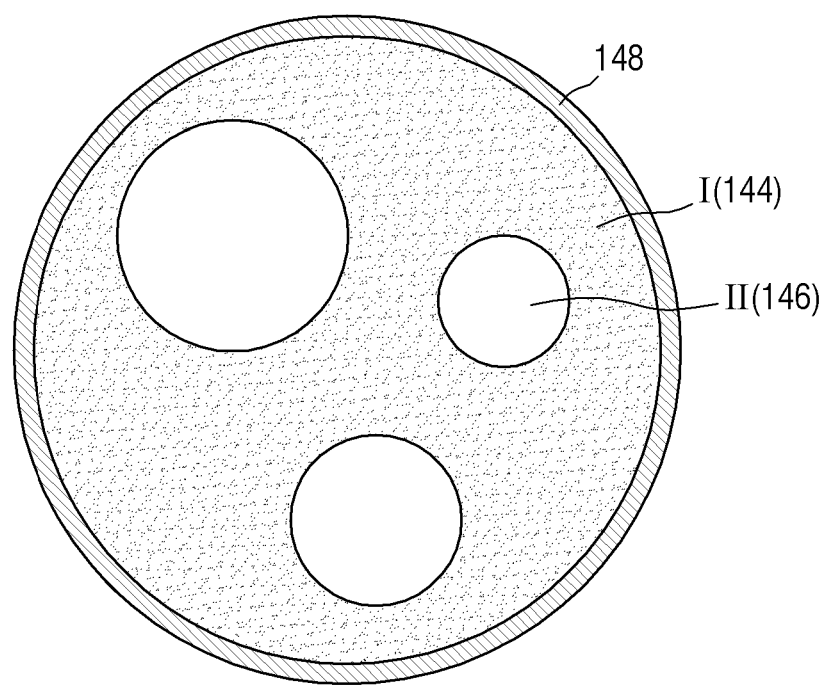

FIGS. 10 to 12 are various plan views for explaining the calibration window of the wafer cleaning apparatus according to some embodiments. For convenience of explanation, repeated parts of contents explained above using FIGS. 1 to 9 will be briefly described or omitted. For example, above descriptions with respect to various components, elements, parts and features may also be applied to corresponding components, elements, parts and features of embodiments illustrated in FIGS. 10 to 12.

Referring to FIGS. 10 to 12, in the wafer cleaning apparatus according to some embodiments, the first region I and the second region II are variously formed as needed.

For example, as explained above using FIGS. 1 to 8, the first coating layer 144 that provides the first region I, and the second coating layer 146 that provides the second region II may be formed in various ways as needed. Accordingly, the wafer cleaning equipment according to some embodiments may provide various customized calibration windows 140, depending on various intensity profiles of the laser L and various temperature profiles of the wafer W.

As an example, as shown in FIG. 10, the light transmissivity of the calibration window 140 may gradually change. For example, the light transmissivity of the first region I may gradually decrease in a direction receding from the second region II. Alternatively, for example, the light transmissivity of the first region I may gradually increase in a direction receding from the second region II. Although only a case where the light transmissivity of the first region I gradually changes is explained, this is merely an example. For example, the light transmissivity of the second region II may gradually change, and both the light transmissivity of the first region I and the light transmissivity of the second region II may gradually change.

As another example, as shown in FIG. 11, the first region I and/or the second region II of the calibration window 140 may be formed radially. For example, the first region I and the second region II are formed radially and may be disposed alternately. For example, the first region I and the second region II may have a fan shape, and a plurality of fanwise first regions I and a plurality of fanwise second regions II may be alternately arranged in an azimuthal direction as shown in FIG. 11. Although the calibration window 140 is only shown as including four first regions I and four second regions II in FIG. 11, this is merely an example, and the number of first regions I and the number of second regions II may be various. For example, the calibration window 140 may have more than four first regions I and more than four second regions II. In certain embodiments, the calibration window 140 may have less than four first regions I and less than four second regions II. Also, unlike the shown case in FIG. 11, at least a part of the plurality of first regions I and/or at least a part of the plurality of second regions II may be continuously disposed.

As still another example, as shown in FIG. 12, the calibration window 140 may include a plurality of second regions II that are spaced apart from each other. The shape and size of each second region II and the number of the second region II are merely examples, and are not limited thereto. For example, at least a part of the second region II may have a form other than a circular shape, e.g., an oval, an ellipse, a rectangle, a triangle, etc.

In some embodiments, the calibration window 140 may also be rotatively disposed on the reflector 130. Therefore, the calibration window 140 may provide various forms for each region.

Figure 13:
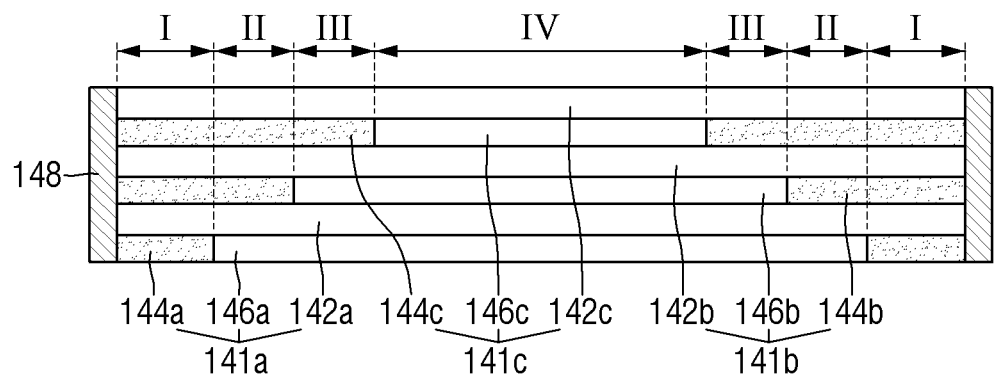
FIG. 13 is a cross-sectional view for explaining a calibration window of the wafer cleaning apparatus according to some embodiments.
Figure 14:
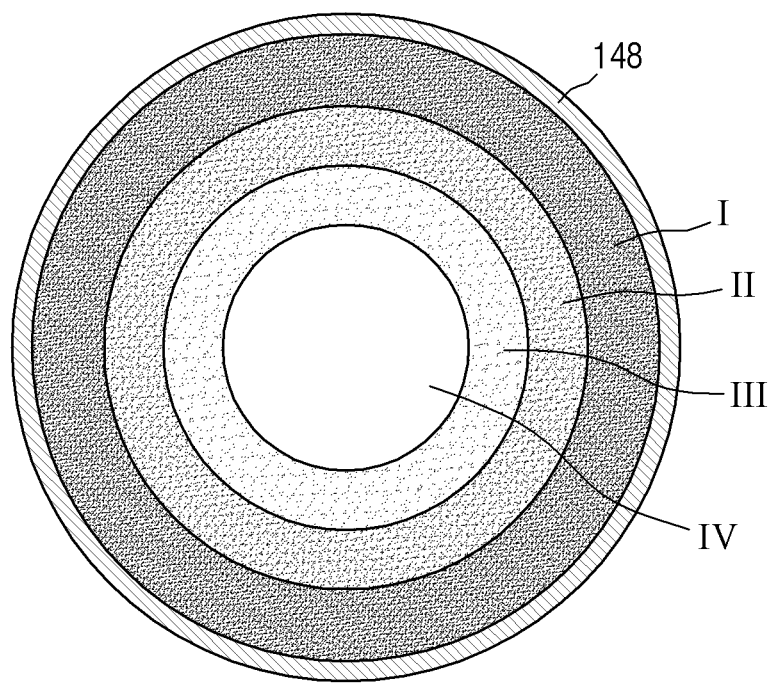
FIG. 14 is a plan view for explaining a calibration window of the wafer cleaning apparatus according to some embodiments.

FIG. 13 is a cross-sectional view for explaining a calibration window of the wafer cleaning apparatus according to some embodiments. FIG. 14 is a plan view for explaining a calibration window of the wafer cleaning apparatus according to some embodiments. For convenience of explanation, repeated parts of contents explained above using FIGS. 1 to 12 will be briefly explained or omitted.

Referring to FIGS. 13 and 14, in the wafer cleaning apparatus according to some embodiments, the calibration window 140 may include a plurality of window structures 141a, 141b, and 141c.

As an example, the calibration window 140 may include first to third window structures 141a, 141b, and 141c that are stacked sequentially. The laser irradiated/emitted from the laser module may sequentially penetrate the first to third window structures 141a, 141b, and 141c. Although the calibration window 140 is only shown as including the three window structures 141a, 141b, and 141c in FIG. 13, this is merely an example, and the number of window structures may vary. In some embodiments, the number of stacked window structures 141a, 141b, and 141c may be about 50 or less. Preferably, the number of stacked window structures 141a, 141b, and 141c may be about 30 or less.

Although the thicknesses of the first to third window structures 141a, 141b, and 141c are only shown as being the same as each other in FIG. 13, this is merely an example, and if necessary, the thicknesses of each of the first to third window structures 141a, 141b, and 141c may differ from each other.

The first to third window structures 141a, 141b, and 141c may respectively include light projection windows 142a, 142b, and 142c, first coating layers 144a, 144b, and 144c and second coating layers 146a, 146b, and 146c.

In some embodiments, the first coating layers 144a, 144b, and 144c of the respective first to third window structures 141a, 141b, and 141c may have areas different from each other. For example, as shown in FIG. 14, the calibration window 140 may include first to fourth regions I to IV different from each other. As an example, a first region I may surround a second region II, the second region II may surround a third region III, and the third region III may surround a fourth region IV. At this time, for example, the first coating layer 144a of the first window structure 141a may cover (e.g., vertically overlap) a light projection window 142a of the first region I, the first coating layer 144b of the second window structure 141b may cover (e.g., vertically overlap) a light projection window 142b of the first and second regions I and II, and the first coating layer 144c of the third window structure 141c may cover (e.g., vertically overlap) a light projection window 142c of the first to third regions I to III.

In such a case, the first to fourth regions I to IV may have light transmissivities different from each other. As an example, the first light transmissivity of the first region I may be smaller/less than the second light transmissivity of the second region II, the second light transmissivity of the second region II may be smaller/less than the third light transmissivity of the third region III, and the third light transmissivity of the third region III may be smaller/less than the fourth light transmissivity of the fourth region IV.

In some embodiments, the annular (or donut-like) first to third regions I to III may have a shape that shares a center with the circular fourth region IV. However, the shapes, sizes, and the like of the first to fourth regions I to IV, and the number of regions are merely examples, and are not limited thereto. In some embodiments, as the number of regions of the calibration window 140 (e.g., first to fourth regions I to IV) increases, the temperature variation on the entire surface of the wafer may be improved more finely.

Figure 15:
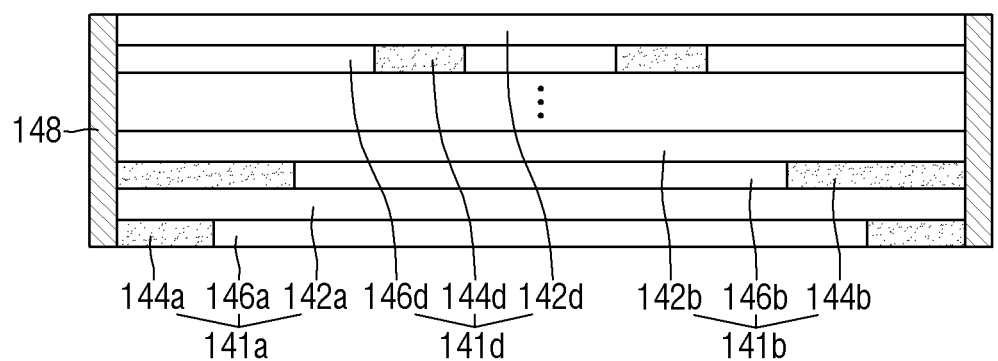
FIG. 15 is a cross-sectional view for explaining the calibration window of the wafer cleaning apparatus according to some embodiments.

FIG. 15 is a cross-sectional view for explaining the calibration window of the wafer cleaning apparatus according to some embodiments. For convenience of explanation, repeated parts of contents explained above using FIGS. 1 to 14 will be briefly explained or omitted.

Referring to FIG. 15, in the wafer cleaning apparatus according to some embodiments, at least some of the plurality of window structures 141a, 141b, and 141d include a plurality of first coating layers 144a, 144b and 144d.

As an example, the plurality of window structures 141a, 141b, and 141d may include a fourth window structure 141d. Each of the window structures 141a, 141b, and 141d may include light projection windows 142a, 142b and 142d, first coating layers 144a, 144b and 144d, and second coating layers 146a, 146b and 146d. At this time, the fourth window structure 141d may include a plurality of first coating layers 144d.

Although the fourth window structure 141d is only shown as including two first coating layers 144d in FIG. 15, this is merely an example, and the number of aspheric lenses may vary. Further, if necessary, the first window structure 141a may include a plurality of first coating layers 144a or the second window structure 141b may include a plurality of first coating layers 144b.

Figure 16:
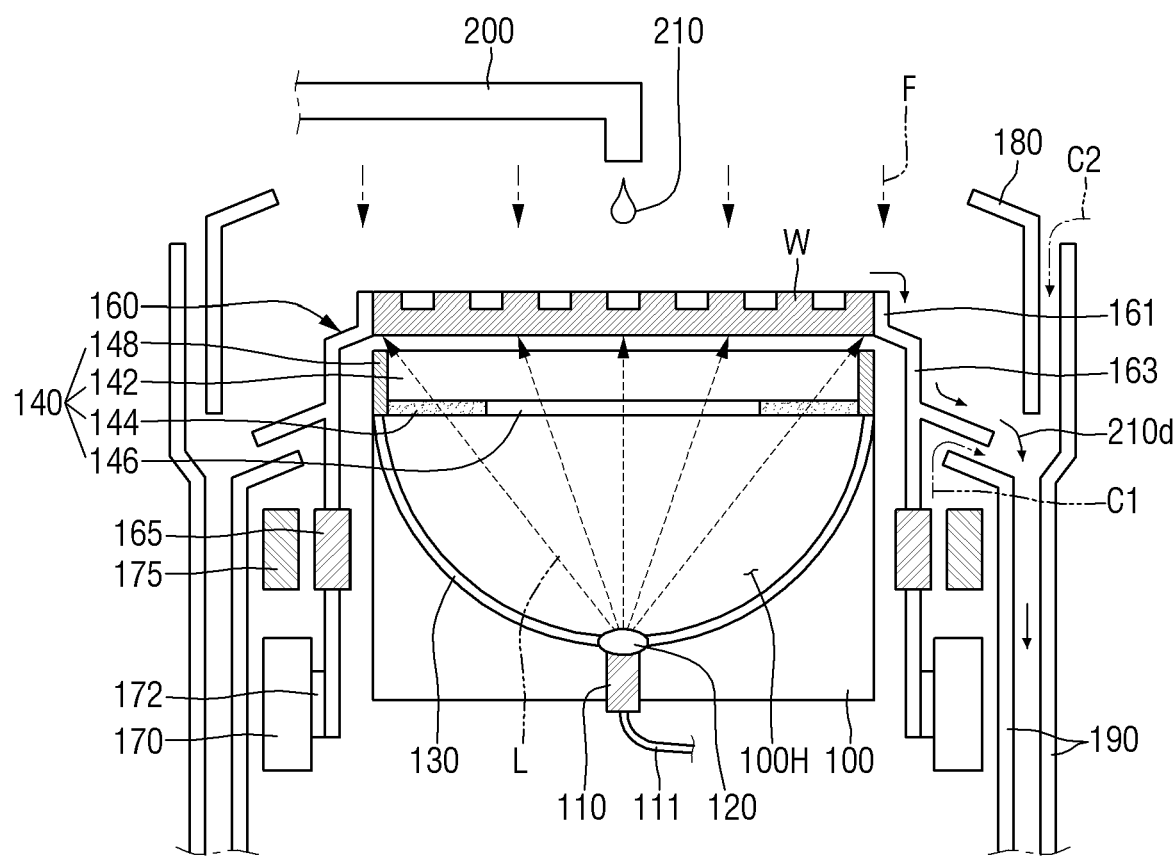
FIGS. 16 to 18 are various cross-sectional views for explaining a wafer cleaning apparatus according to some embodiments.
Figure 17:
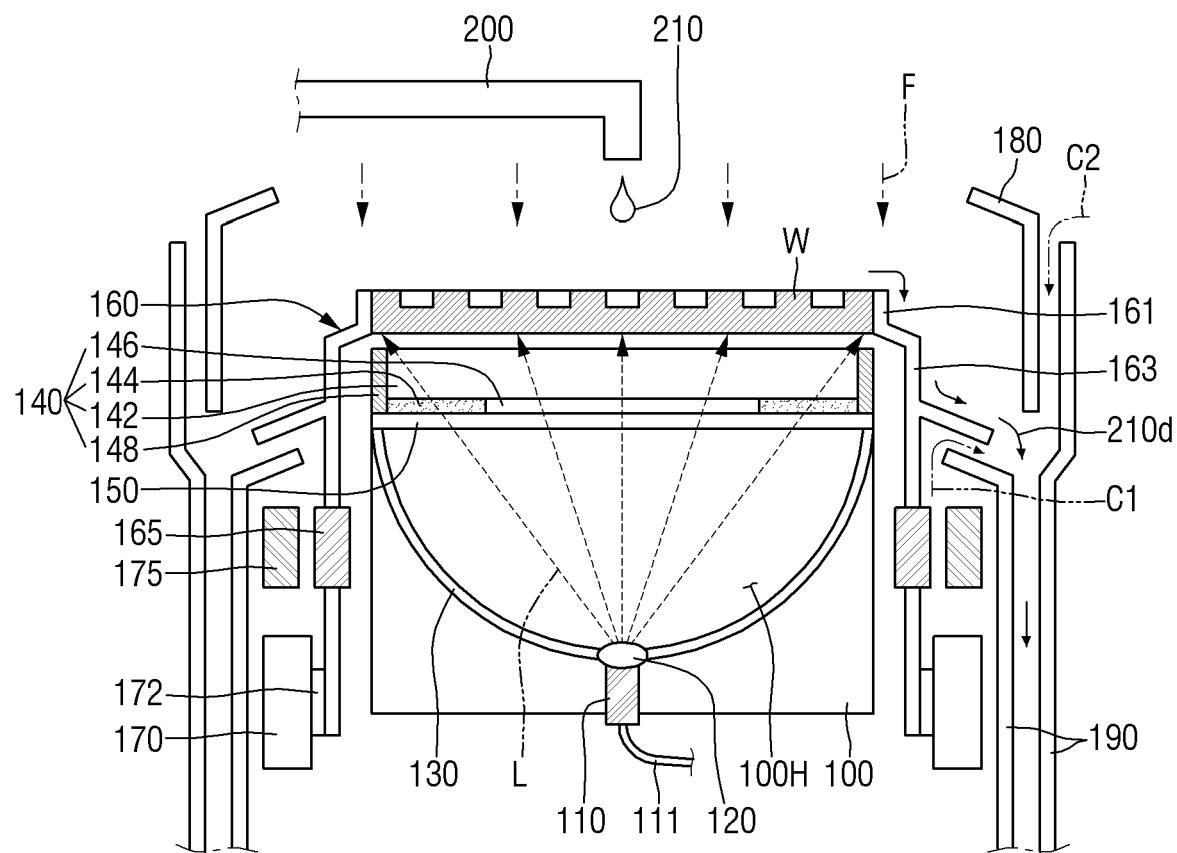
Figure 18:
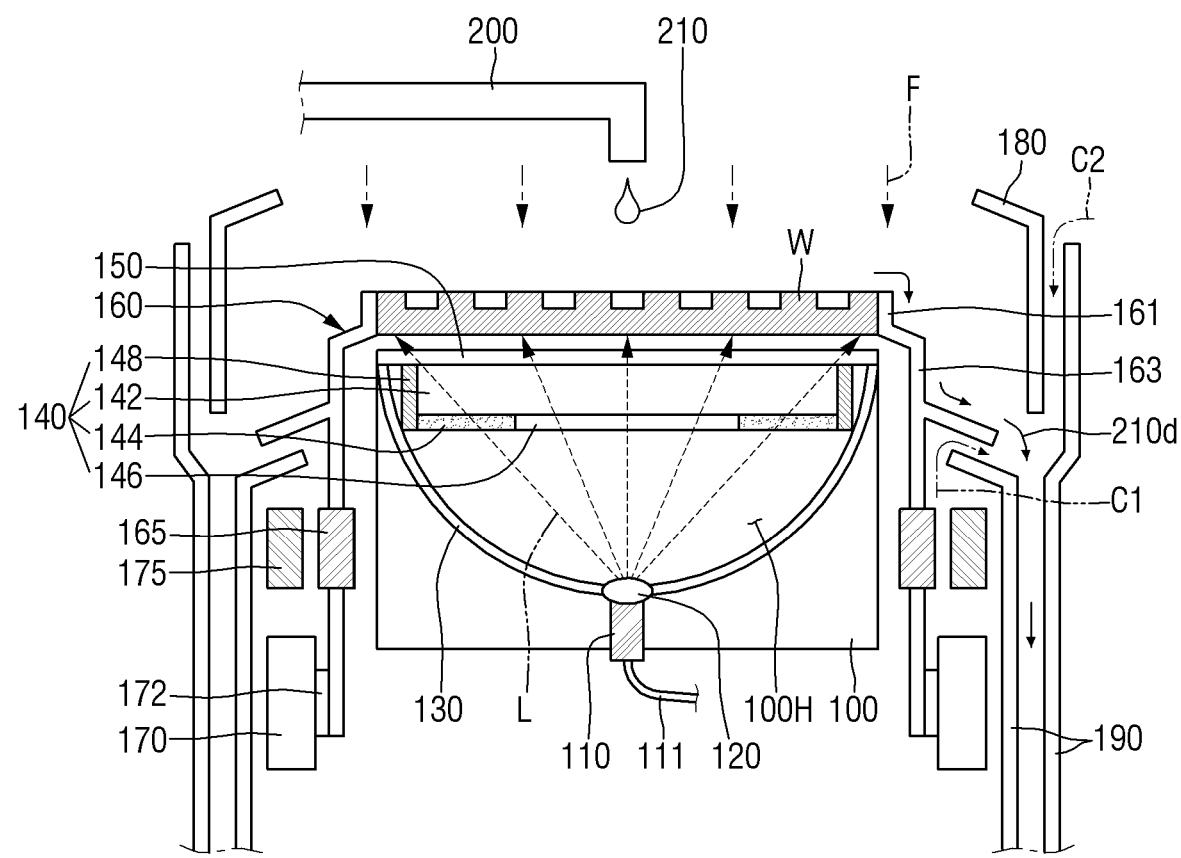

FIGS. 16 to 18 are various cross-sectional views for explaining a wafer cleaning apparatus according to some embodiments. For convenience of explanation, repeated parts of contents explained above using FIGS. 1 to 15 will be briefly explained or omitted.

Referring to FIG. 16, the wafer cleaning apparatus according to some embodiments does not include a transparent window 150.

For example, the calibration window 140 may be disposed adjacent to the wafer W. Accordingly, it is possible to minimize the outflow of the laser L passing through the calibration window 140 to a region other than the wafer W. For example, the calibration window 140 of FIG. 16 may replace a combined structure of the transparent window 150 and the calibration window 140 of FIG. 1. In some embodiments, the calibration window 140 may not be in contact with the wafer W. Accordingly, the calibration window 140 may not rotate, even while the chuck 160 and the wafer W rotate together.

Referring to FIG. 17, in the wafer cleaning apparatus according to some embodiments, the transparent window 150 is interposed between the reflector 130 and the calibration window 140.

Although the calibration window 140 is only shown as being in contact with the transparent window 150 in FIG. 17, this is merely an example. Unlike the shown case in FIG. 17, the calibration window 140 may be spaced apart from the transparent window 150.

In some embodiments, the transparent window 150 may cover the reflector 130. For example, the transparent window 150 may vertically overlap the whole area of the reflector 130. In such a case, the hollow region 100H may be isolated from the outside by the reflector 130 and the transparent window 150. The reflector 130 and the transparent window 150 may prevent the hollow region 100H in which the laser L progresses from being contaminated by the fume generated from the chemical 210. In some embodiments, the hollow region 100H may be provided in vacuum. The hollow region 100H provided in vacuum may facilitate the progress of the laser L. For example, the transparent window 150 and the reflector 130 may be airtightly attached.

Referring to FIG. 18, in the wafer cleaning apparatus according to some embodiments, at least a part of the calibration window 140 is disposed in the reflector 130.

For example, the calibration window 140 may be disposed inside the hollow region 100H. In some embodiments, the transparent window 150 may cover the reflector 130. For example, the transparent window 150 may vertically overlap the whole area of the reflector 130. In such a case, the hollow region 100H in which the calibration window 140 is disposed may be isolated from the outside by the reflector 130 and the transparent window 150. Although the calibration window 140 is only shown as being in contact with the transparent window 150 in FIG. 18, this is merely an example. Unlike the shown case in FIG. 18, the calibration window 140 may be spaced apart from the transparent window 150.

Hereinafter, a method for cleaning a wafer according to exemplary embodiments will be described referring to FIGS. 1 to 19.

Figure 19:
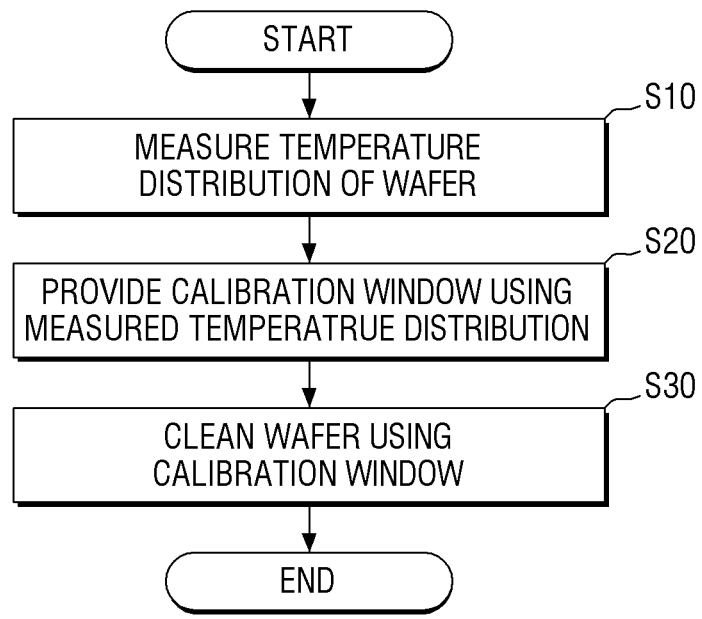
FIG. 19 is a flowchart for explaining the method for cleaning a wafer using the wafer cleaning apparatus according to some embodiments.

FIG. 19 is a flowchart for explaining the method for cleaning the wafer using the wafer cleaning apparatus according to some embodiments. For convenience of explanation, repeated parts of contents explained above using FIGS. 1 to 18 will be briefly described or omitted.

Referring to FIG. 19, the method for cleaning the wafer using the wafer cleaning apparatus according to some embodiments may include measurement (S10) of a temperature gradient of the wafer W, provision (S20) of the calibration window 140 using the measured temperature gradient, and cleaning (S30) of the wafer W using the calibration window 140.

The measurement (S10) of temperature gradient of the wafer W may be performed by measuring the temperature of the lower surface of the wafer W heated by the laser L in the wafer cleaning apparatus according to some embodiments. The measurement of the temperature of the lower surface of the wafer W may include, but is not limited to, for example, usage of a pyrometer and/or a charged-coupled device (CCD) camera. Accordingly, as an example, a graph as shown in FIG. 9 may be provided.

The provision (S20) of the calibration window 140 may be performed by adjusting the transmissivity of the calibration window 140 to the laser L for each region based on the measured temperature gradient. As an example, when a graph as shown in FIG. 9 is provided, the calibration window 140 including the first region I having the first light transmissivity and the second region II having the second light transmissivity greater than the first light transmissivity may be provided.

The cleaning (S30) of the wafer W may be performed by utilizing the wafer cleaning apparatus described above referring to FIGS. 1 to 18. This will be described more specifically below in the description of FIG. 20. Accordingly, a method for cleaning a wafer with improved performance may be provided.

Hereinafter, the method for fabricating the semiconductor device according to an exemplary embodiment will be described referring to FIGS. 1 to 20.

Figure 20:
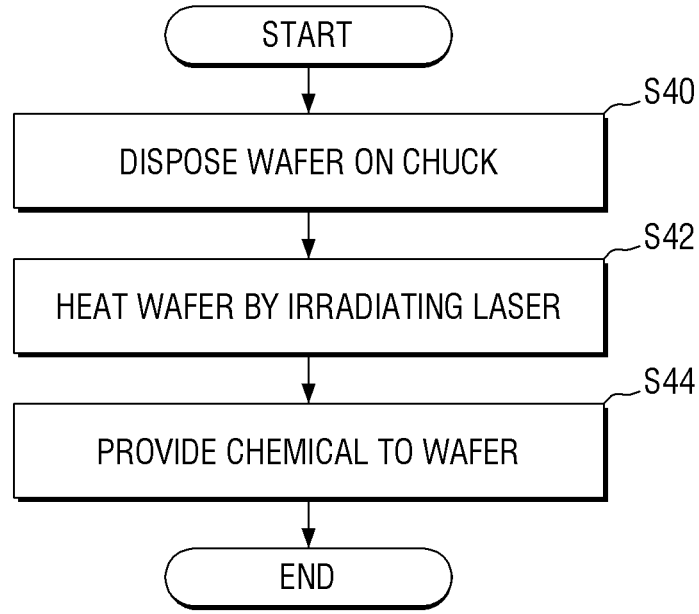
FIG. 20 is a flowchart for explaining a method for fabricating a semiconductor device using the wafer cleaning apparatus according to some embodiments.

FIG. 20 is a flowchart for explaining a method for fabricating a semiconductor device using the wafer cleaning apparatus according to some embodiments. For convenience of explanation, repeated parts of contents explained above using FIGS. 1 to 19 will be briefly explained or omitted.

Referring to FIG. 20, the method for fabricating the semiconductor device using the wafer cleaning apparatus according to some embodiments includes disposition (S40) of the wafer W on the chuck 160, heating (S42) of the wafer W by irradiating/emitting the laser L, and supplying (S44) of the chemical 210 to the wafer W.

The disposition (S40) of the wafer W on the chuck 160 may be performed by fixing the wafer W to the grip portion 161 of the chuck 160. As the chuck 160 rotates, the wafer W fixed on/to the chuck 160 may also rotate. In some embodiments, the wafer W may be a wafer subjected to the exposure process. For example, the wafer W may include an exposed portion Wb and a non-exposed portion Wa. The wafer W may include, but is not limited to, a photoresist film.

The heating (S42) of the wafer W may be performed by irradiating the lower surface of the wafer W with the laser L. The irradiation/radiation of the laser L to the lower surface of the wafer W may be performed using the laser module 110. As described above using FIGS. 1 to 8, the laser L irradiated/emitted from the laser module 110 may penetrate the optical system 120 and the calibration window 140, and reach the lower surface of the wafer W.

The supplying (S44) of the chemical 210 to the wafer W may be performed, using the chemical supply unit 200. The chemical 210 supplied from the chemical supply unit 200 may be provided to the upper surface of the wafer W. As a result, the wafer W may be cleaned. In some embodiments, the cleaning of the wafer W may be performed by a puddle method that utilizes the surface tension of the chemical 210.

In some embodiments, the chemical 210 supplied to the wafer W may remove either the exposed portion Wb or the unexposed portion Wa. As an example, the chemical 210 supplied to the wafer W may remove the exposed portion Wb, and the non-exposed portion Wa may remain to form a photoresist pattern. As another example, the chemical 210 supplied to the wafer W may remove the non-exposed portion Wa, and the exposed portion Wb may remain to form a photoresist pattern. Accordingly, a developing process of the wafer W may be performed to fabricate a semiconductor device including a predetermined pattern.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating a semiconductor device, the method comprising:
   disposing a wafer on a rotatable chuck;
   irradiating a lower surface of the wafer with a laser to heat the wafer; and
   supplying a chemical to an upper surface of the wafer to clean the wafer,
   wherein the laser penetrates an optical system including an aspheric lens array,
   wherein the laser penetrates a calibration window, which includes a first window structure including a first light projection window including first and second regions different from each other, a first coating layer covering the first region of the first light projection window, and a second coating layer covering the second region of the first light projection window,
   wherein the first coating layer and the second coating layer have different light transmissivities from each other,
   wherein the first coating layer surrounds the second coating layer, and
   wherein a first light transmissivity of the first coating layer is smaller than a second light transmissivity of the second coating layer.

2. The method of fabricating the semiconductor device of claim 1, wherein the wafer includes an exposed portion and a non-exposed portion, and
   one of the exposed portion and the non-exposed portion is removed by the chemical.

3. The method of fabricating the semiconductor device of claim 1, wherein cleaning of the wafer is performed by a puddle method which uses a surface tension of the chemical.

4. The method of fabricating the semiconductor device of claim 1, wherein the calibration window further includes a second window structure,
   the laser is sequentially transmitted through the first and second window structures, and
   the second window structure includes a second light projection window including a third and a fourth regions, a third coating layer covering the third region, and a fourth coating layer covering the fourth region.

5. The method of fabricating the semiconductor device of claim 4, wherein an area of the first coating layer of the first window structure is different from an area of the third coating layer of the second window structure.

6. The method of fabricating the semiconductor device of claim 1, wherein the first light transmissivity is 80% to 95%, and the second light transmissivity is 95% to 99.9%.

7. The method of fabricating the semiconductor device of claim 1, wherein the first coating layer has an annular shape, and the second coating layer has a circular shape,
   a diameter of the second coating layer is 250 mm to 330 mm, and
   a diameter of the first coating layer is greater than the diameter of the second coating layer and is 400 mm or less.

8. The method of fabricating the semiconductor device of claim 4, wherein the first coating layer is formed on a surface of the first region of the first light projection window, the second coating layer is formed on a surface of the second region of the first light projection window, the third coating layer is formed on a surface of the third region of the second light projection window, and the fourth coating layer is formed on a surface of the fourth region of the second light projection window.

9. The method of fabricating the semiconductor device of claim 8, wherein the first light projection window is formed of a glass and the second light projection window is formed of a glass.

10. A method of fabricating a semiconductor device, the method comprising:
    disposing a wafer on a chuck;
    irradiating a lower surface of the wafer with a laser to heat the wafer; and
    supplying a chemical to an upper surface of the wafer to clean the wafer,
    wherein the laser penetrates an optical system including a lens array,
    wherein the laser penetrates a calibration window, which includes a first window structure including a first light projection window including first and second regions different from each other, a first coating layer covering the first region of the first light projection window, and a second coating layer covering the second region of the first light projection window, wherein the first coating layer and the second coating layer have different light transmissivities from each other, and wherein the laser is transmitted through the first coating layer to have a lower intensity at the chuck as compared to an intensity of the laser at the chuck that is transmitted through the second coating layer.

11. The method of claim 10, wherein the first coating layer is formed on a bottom surface of the first region of the first light projection window and the second coating layer is formed on a bottom surface of the second region of the first light projection window.

12. The method of claim 11, wherein the first light projection window is formed of a glass.

13. A method of fabricating a semiconductor device, the method comprising:

disposing a wafer on a chuck;

irradiating a lower surface of the wafer with a laser to heat the wafer; and supplying a chemical to an upper surface of the wafer to clean the wafer, wherein the laser penetrates an optical system including a lens array, wherein the laser penetrates a calibration window which includes a light projection window including a lower surface, a first coating layer having a first light transmissivity on the lower surface of the light projection window, and a second coating layer having a second light transmissivity greater than the first light transmissivity on the lower surface of the light projection window, and wherein the second coating layer includes first to third sub-coating layers which are sequentially stacked on the lower surface of the light projection window, and refractive indexes of the first to third sub-coating layers decreases in a direction receding from the lower surface of the light projection window.

14. The method of claim 13, wherein the first coating layer surrounds the second coating layer.

15. The method of claim 13, wherein the light projection window is formed of a glass.

* * * * *